US010683580B2

(12) United States Patent
Kim et al.

(10) Patent No.: US 10,683,580 B2
(45) Date of Patent: Jun. 16, 2020

(54) METALLIC NANOSPRING AND METHOD FOR MANUFACTURING OF THE SAME

(71) Applicant: KOREA UNIVERSITY RESEARCH AND BUSINESS FOUNDATION, Seoul (KR)

(72) Inventors: Young Keun Kim, Seoul (KR); Su Hyo Kim, Seoul (KR); Da-yeon Nam, Incheon (KR); Yoo Sang Jeon, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 29 days.

(21) Appl. No.: 15/881,242

(22) Filed: Jan. 26, 2018

(65) Prior Publication Data

US 2018/0327919 A1  Nov. 15, 2018

(30) Foreign Application Priority Data

May 15, 2017 (KR) .......................... 10-2017-0059757

(51) Int. Cl.
*C25D 1/20* (2006.01)
*C25D 1/00* (2006.01)
(Continued)

(52) U.S. Cl.
CPC .......... *C25D 1/006* (2013.01); *B81C 99/0085* (2013.01); *B82B 1/002* (2013.01);
(Continued)

(58) Field of Classification Search
None
See application file for complete search history.

(56) References Cited

U.S. PATENT DOCUMENTS 10,132,699 B1 * 11/2018 Pillars ..................... G01L 1/125
2010/0328896 A1 * 12/2010 Shaddock ............. B82Y 30/00
361/704
2015/0333024 A1 11/2015 Tanie et al.

FOREIGN PATENT DOCUMENTS

JP   H01198493 A   8/1989
JP   H0259875 B2   12/1990
(Continued)

OTHER PUBLICATIONS

Esmaeily, A.S., et al., "Diameter-modulated ferromagnetic CoFe nanowires", Journal of Applied Physics, 113, 17A327, 2013 (Year: 2013).*

(Continued)

*Primary Examiner* — Stefanie S Wittenberg
(74) *Attorney, Agent, or Firm* — Jenkins, Wilson, Taylor & Hunt, P.A.

(57) ABSTRACT

A method for manufacturing a metallic nanospring includes preparing a nanotemplate having a nanopore and including a working electrode disposed on its one surface, preparing a first metal precursor mixture including ascorbic acid ($C_6H_8O_6$), vanadium (IV) oxide sulfate ($VOSO_4 \cdot xH_2O$), and a metal precursor solution including a metal desired to be deposited, preparing a second metal precursor mixture by mixing the first metal precursor mixture with nitric acid ($HNO_3$), depositing a metallic nanospring into the nanopore using electrodeposition by dipping the nanotemplate into the second metal precursor mixture and applying current between a counter electrode inserted into the second metal precursor mixture and the working electrode, and selectively removing the working electrode on the nanotemplate with the deposited metallic nanospring and the nanotemplate.

8 Claims, 7 Drawing Sheets

(51) Int. Cl.
| | |
|---|---|
| *B82B 1/00* | (2006.01) |
| *B82B 3/00* | (2006.01) |
| *F16F 1/06* | (2006.01) |
| *F16F 1/02* | (2006.01) |
| *B81C 99/00* | (2010.01) |
| *C25D 3/56* | (2006.01) |
| *C25D 11/04* | (2006.01) |

(52) U.S. Cl.
CPC .......... *B82B 3/0023* (2013.01); *F16F 1/021* (2013.01); *F16F 1/06* (2013.01); *C25D 3/562* (2013.01); *C25D 11/045* (2013.01); *F16F 2224/0208* (2013.01); *F16F 2226/00* (2013.01)

(56) References Cited

FOREIGN PATENT DOCUMENTS

| | | | |
|---|---|---|---|
| JP | 2002-212770 A | 7/2002 | |
| JP | 2008-126370 A | 6/2008 | |
| KR | 1020140075636 A | 6/2014 | |
| KR | 101711888 B1 | 3/2017 | |
| WO | WO 2008/155864 A1 | 12/2008 | |
| WO | WO 2014/109014 A1 | 7/2014 | |
| WO | WO2016114627 * | 7/2016 | ............... B22F 9/24 |

OTHER PUBLICATIONS

Li, J., et al., "Template electrosynthesis of tailored-made helical nanoswinnners", Nanoscale Communication, 2014, 6, 9415. (Year: 2014).*

Liu, L., et al., "Wet-chemical synthesis of palladium nanosprings", Nano Letters, 2011, 11, 3979-3982. (Year: 2011).*

Yang, D., et al., "Wet-chemical approaches to porous nanowires with linear, spiral, and meshy topologies", Nano Letters, 2013, 13, 5642-5646. (Year: 2013).*

Yoon, S.J., et al., "Compositional Dependence of Magnetic Properties in CoFe/Au Nanobarcodes", Applied Physics Express 5, 2012, 103003. (Year: 2012).*

Yang, D., et al., "Shape-controlled synthesis of palladium and copper superlattice nanowires for high-stability hydrogen sensors", Scientific Reports, 4, 3773, 2014. (Year: 2014).*

Korean Office Action for Application No. 10-2017-0059757 dated Apr. 4, 2018.

Korean Grant of Patent for Application No. 10-2017-0059757 dated Oct. 19, 2018.

Japanese Office Action for Application No. 2017-206181 dated Nov. 6, 2018.

* cited by examiner

METALLIC NANOSPRING AND METHOD FOR MANUFACTURING OF THE SAME

CROSS-REFERENCE TO RELATED APPLICATIONS

This U.S. non-provisional patent application claims priority under 35 U.S.C. § 119 to Korean Patent Application No. 10-2017-0059757, filed on May 15, 2017, in the Korean Intellectual Property Office, the entire contents of which are incorporated by reference herein.

TECHNICAL FIELD

The present disclosure relates to a method for manufacturing a nanospring and, more particularly, to a method for manufacturing a metallic nanospring using electrodeposition.

BACKGROUND

A well-known nanostructure such as nanoparticle, nanowire or nanotube has a simple shape. A nanospring structure may be synthesized using an anodized alumina oxide nanotemplate which is one of nanowire or nanotube synthesis methods.

Nanospring manufacturing methods include glancing angle deposition, electrodeposition using an anodized alumina oxide nanotemplate, a rolled-up method of rolling up a thin film after deposition of the thin film, and the like.

A method for manufacturing a nanotube using electrodeposition is disclosed in Korean Patent Registration No. 10-1711888.

A nanospring structure having magnetic properties may be applied to a sensor, an actuator, and a motor, a bioapplication or the like under an external magnetic field.

SUMMARY

Example embodiments of the present disclosure provide a simple and massive synthesis method of a metal and/or an alloy nanospring having magnetic properties.

According to example embodiments of the present disclosure, after a metal precursor contained in metal oxide or transition metal fills in a nanotemplate such as anodized alumina oxide nanotemplate, a nanospring is synthesized using electrodeposition. If the nanotemplate is removed, the nanospring may be extracted. Thus, an element desired to be synthesized and a nanospring of a desired shape may be manufactured.

A method for manufacturing a metallic nanospring according to an example embodiment of the present disclosure includes: preparing a nanotemplate having a nanopore and including a working electrode disposed on its one surface; preparing a first metal precursor mixture including ascorbic acid ($C_6H_8O_6$), vanadium (IV) oxide sulfate ($VOSO_4 \cdot xH_2O$), and a metal precursor solution including a metal desired to be deposited; preparing a second metal precursor mixture by mixing the first metal precursor mixture with nitric acid ($HNO_3$); depositing a metallic nanospring into the nanopore using electrodeposition by dipping the nanotemplate into the second metal precursor mixture and applying current between a counter electrode inserted into the second metal precursor mixture and the working electrode; and selectively removing the working electrode on the nanotemplate with the deposited metallic nanospring and the nanotemplate.

In an example embodiment of the present disclosure, the metal precursor solution may include at least one of cobalt (III) sulfate heptahydrate ($CoSO_4 \cdot 7H_2O$) and iron (II) sulfate heptahydrate ($FeSO_4 \cdot 7H_2O$).

In an example embodiment of the present disclosure, a concentration of the second metal precursor mixture may be between 0.01 and 10 M, a concentration of cobalt (III) sulfate heptahydrate ($CoSO_4 \cdot 7H_2O$) may be 40 mM, a concentration of vanadium (IV) oxide sulfate ($VOSO_4 \cdot xH_2O$) may be 20 mM, a concentration of iron (II) sulfate heptahydrate ($FeSO_4 \cdot 7H_2O$) may be 40 mM, and a concentration of ascorbic acid ($C_6H_8O_6$) may be 20 mM.

In an example embodiment of the present disclosure, a pH of the second metal precursor mixture may be between 1.5 and 2.5.

In an example embodiment of the present disclosure, a mean diameter of the nanopore may be between 5 and 500 nanometers.

In an example embodiment of the present disclosure, the method may further include: dipping the nanotemplate into the second metal precursor mixture and depressurizing a plating bath storing the second metal precursor solution. A pressure of the plating bath may be between 100 and 700 Torr.

In an example embodiment of the present disclosure, a density of current flowing to the working electrode during electrodeposition may be between 0.1 and 300 mA/cm$^2$, and a time required for the electrodeposition may be between one minute and 48 hours.

In an example embodiment of the present disclosure, a concentration of the ascorbic acid may be between 20 and 100 mM.

A metallic nanospring according to an example embodiment of the present disclosure may be manufactured by the above-described method.

A nanocomponent according to an example embodiment of the present disclosure may include a metallic nanospring.

BRIEF DESCRIPTION OF THE DRAWINGS

The present disclosure will become more apparent in view of the attached, example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
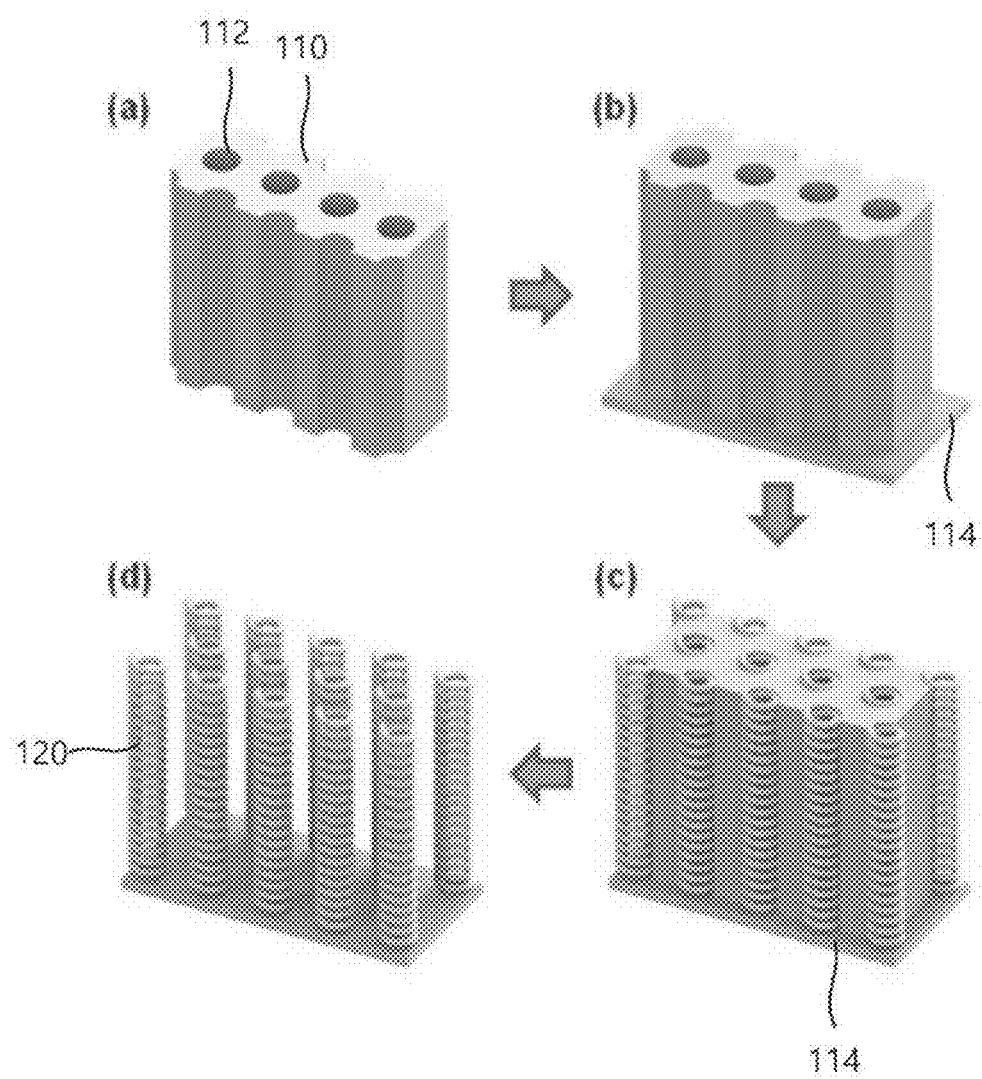
FIG. 1 illustrates a method for manufacturing a metallic nanospring according to an example embodiment of the present disclosure.

Example embodiments of the present disclosure relate to a method for manufacturing a magnetic transition metal and/or an alloy nanospring using metal oxide or transition metal compound.

According to an example embodiment of the present disclosure, a method for manufacturing a nanospring using ascorbic acid (C$_6$H$_8$O$_6$) conventionally known as an antioxidizing material is proposed. More specifically, a nanospring including a metal desired to be deposited may be manufactured using a first metal precursor mixture including ascorbic acid (C$_6$H$_8$O$_6$), vanadium (IV) oxide sulfate (VOSO$_4$.xH$_2$O), and a metal precursor solution including a metal desired to be deposited. More specifically, a material of the nanospring may be CoFe.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1 illustrates a method for manufacturing a metallic nanospring according to an example embodiment of the present disclosure.

Referring to FIG. 1, a method for a metallic nanospring includes preparing a nanotemplate 110 having a nanopore 112 and including a working electrode 114 disposed on its one surface; preparing a first metal precursor mixture including ascorbic acid (C$_6$H$_8$O$_6$), vanadium (IV) oxide sulfate (VOSO$_4$.xH$_2$O), and a metal precursor solution including a metal desired to be deposited; preparing a second metal precursor mixture by mixing the first metal precursor mixture with nitric acid (HNO$_3$); depositing a metallic nanospring 120 into the nanopore 112 using electrodeposition by dipping the nanotemplate 110 into the second metal precursor mixture and applying current between a counter electrode inserted into the second metal precursor mixture and the working electrode 114; and selectively removing the working electrode 114 on the nanotemplate 110 with the deposited metallic nanospring 120 and the nanotemplate 110.

Referring to (a) and (b) in FIG. 1, a nanotemplate 110 having a nanopore 112 and including a working electrode 114 disposed on its one surface is prepared. A material of the nanotemplate 100 may be anodized alumina oxide (AAO) or thermoplastic. The anodized alumina oxide nanotemplate may be obtained by anodizing aluminum. The anodization may be performed using a method well known in the art. For example, the anodization may be performed using a two-step anodization process. A material of a thermoplastic nanotemplate may be polycarbonate (PC). A nanopore of the anodized alumina oxide or thermoplastic nanotemplate may have a mean diameter between 5 and 500 nanometers. The nanopore may be formed through the nanotemplate 110.

The working electrode 114 may be deposited on one surface of the nanotemplate 110. Thus, one end of the nanopore 112 may be blocked by the working electrode. The working electrode 114 may include a metal or a metal-alloy which is different from a material of a nanospring desired to be deposited. The working electrode 114 may include platinum (Pt), palladium (Pd), gold (Au), silver (Ag), copper (Cu) or an alloy thereof. The working electrode 114 may be deposited on one surface of the nanotemplate 110 to a thickness between 250 and 350 nanometers by using an electron-beam (e-beam) evaporator or a sputtering deposition system.

A first metal precursor mixture including ascorbic acid (C$_6$H$_8$O$_6$), vanadium (IV) oxide sulfate (VOSO$_4$.xH$_2$O), and a metal precursor solution including a metal desired to be deposited is prepared. The ascorbic acid (C$_6$H$_8$O$_6$) may serve as a shape controller, and a shape or pitch of the nanospring 120 may be controlled by controlling the amount of the ascorbic acid (C$_6$H$_8$O$_6$).

A material of the nanospring 120 may be decided by metal ions included in the metal precursor solution. If the nanospring 120 includes a magnetic alloy such as CoFe, the metal precursor solution may include a plurality of metal ions. More specifically, the metal precursor solution may include at least one of cobalt (III) sulfate heptahydrate (CoSO$_4$.7H$_2$O) and iron (II) sulfate heptahydrate (FeSO$_4$.7H$_2$O). If the metal precursor solution contains cobalt (III) sulfate heptahydrate (CoSO$_4$.7H$_2$O) and iron (II) sulfate heptahydrate (FeSO$_4$.7H$_2$O), a concentration of cobalt (III) sulfate heptahydrate (CoSO$_4$.7H$_2$O) may be about 40 mM, a concentration of vanadium (IV) oxide sulfate (VOSO$_4$.xH$_2$O) may be about 20 mM, a concentration of iron (II) sulfate heptahydrate (FeSO$_4$.7H$_2$O) may be about 40 mM, and a concentration of ascorbic acid (C$_6$H$_8$O$_6$) may be about 20 mM.

A composition ratio in the nanospring 120 is lower than a composition ratio in the metal precursor solution. For this reason, vanadium (IV) oxide sulfate (VOSO$_4$.xH$_2$O) is interpreted to serve as a catalyst during electrodeposition.

In a metal precursor solution including metal ions, it is all right to select any metal ion. However, considering electric, magnetic, and thermal conductivities, it is more preferable to select a metal ion originating from transition metal oxide containing a transition metal such as nickel (Ni), cobalt (Co), iron (Fe) or chrome (Cr). In the metal precursor solution, the metal ion may originate from a transition metal, a noble metal or a rare-earth metal. The transition metal may include Fe, Co or Ni. The noble metal may include gold or silver. The rare-earth metal may include neodymium (Nd), samarium (Sm) or gadolinium (Gd).

A second metal precursor mixture is prepared by mixing nitric acid (HNO$_3$) with the first meal precursor mixture. The nitric acid (HNO$_3$) adjusts a pH of the second metal precursor mixture. The pH of the second metal precursor mixture may be between 1.5 and 2.5. A molarity of the second metal precursor mixture may be between 0.001 and 50 M. If the molarity of the second metal precursor mixture is 0.001 M or less, the second metal precursor mixture is not efficiently adsorbed to the nanotemplate 110 because the molarity of 0.001 M or less is too low. If the molarity of the second metal precursor mixture is greater than 50 M, a metallic nanospring that is a target of the present disclosure is not economical.

The nanotemplate 110 may be dipped into the second metal precursor mixture, and a plating bath storing the second precursor mixture may be depressurized. The depressurization may be performed using a vacuum pump, and air filling the nanopore 112 may be released by the depressurization to fill the nanopore 112 with the second metal precursor mixture. A pressure of the plating bath may be between 100 and 700 Torr.

Referring to (c) in FIG. 1, a metallic nanospring is deposited into the nanopore 112 using electrodeposition by dipping the nanotemplate 110 into the second metal precursor mixture and applying current between a counter electrode inserted into the second metal precursor mixture and the working electrode 114. The working electrode 114 may include silver (Ag), and the counter electrode may include platinum (Pt). During the electrodeposition, a density of current flowing to the working electrode 114 may be between 0.1 and 300 mA/cm$^2$. Time required for the electrodeposition may be between one minute and 48 hours. During the electrodeposition, a temperature of the plating bath may be between zero and 80 degrees Celsius.

Referring to (d) in FIG. 1, the working electrode 114 on the nanotemplate 110 with the deposited metallic nanospring 120 and the nanotemplate 110 are selectively removed.

The nanotemplate 110 extracted from the plating bath is dipped into a separate wet etching bath, and the working electrode 114 is removed by wet etching. Then, the nanotemplate 110 is dipped into another wet etching path and is removed. If a material of the nanotemplate 110 is anodized alumina oxide, an etchant may be sodium hydroxide (NaOH). Finally, the nanospring 120 may be cleaned by deionized water (DI water) and may be dispersed in ethanol ($C_2H_6O$).

Figure 2:
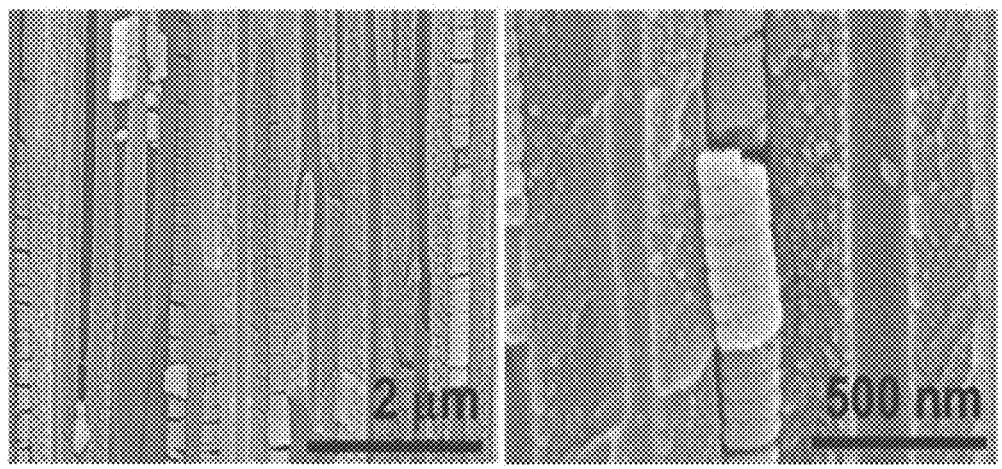
FIG. 2 is a scanning electron microscope (SEM) image of a nanospring synthesized using electrodeposition according to an example embodiment of the present disclosure.

FIG. 2 is a scanning electron microscope (SEM) image of a nanospring synthesized using electrodeposition according to an example embodiment of the present disclosure.

Figure 3:
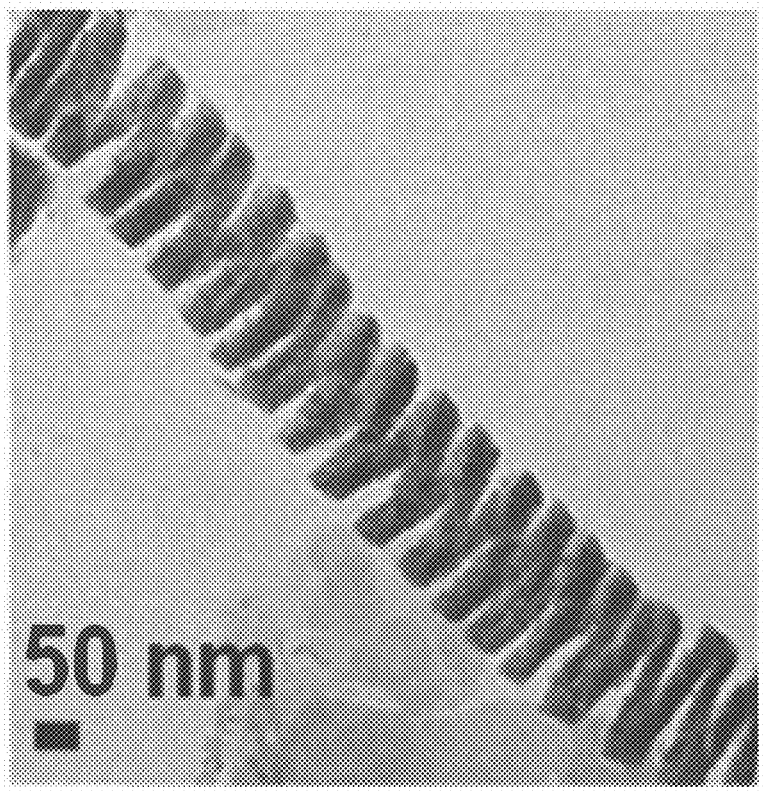
FIG. 3 is a transmission electron microscope (TEM) image of a nanospring synthesized using electrodeposition according to an example embodiment of the present disclosure.

FIG. 3 is a transmission electron microscope (TEM) image of a nanospring synthesized using electrodeposition according to an example embodiment of the present disclosure.

Referring to FIGS. 2 and 3, a metal precursor solution contains cobalt (III) sulfate heptahydrate ($CoSO_4 \cdot 7H_2O$) and iron (II) sulfate heptahydrate ($FeSO_4 \cdot 7H_2O$). A CoFe nanospring manufactured using electrodeposition has an outside diameter of 200 nanometers and an inside diameter of 100 nanometers. The nanospring has a thickness between 30 and 50 nanometers.

Figure 4:
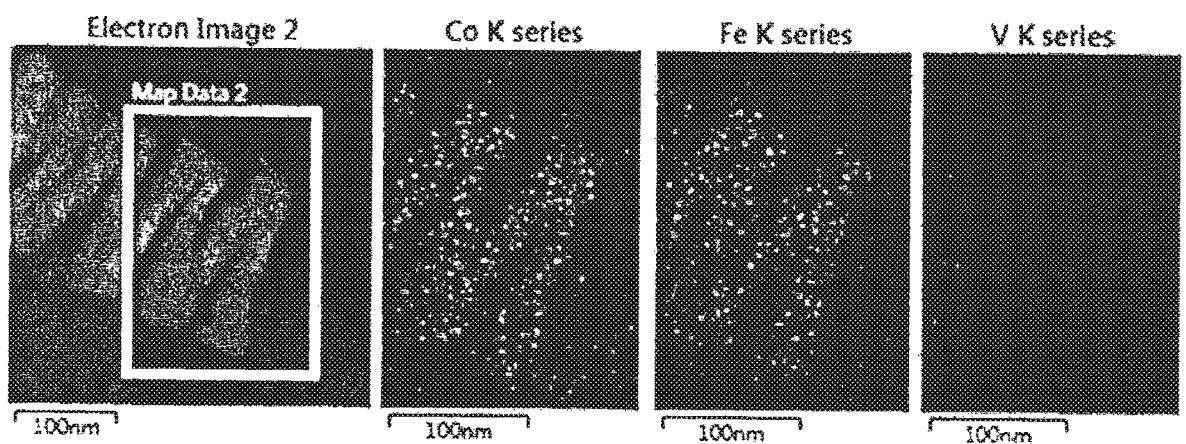
FIG. 4 is a mapping image obtained by analyzing a nanospring synthesized using electrodeposition with a transmission electron microscope and element analysis according to an example embodiment of the present disclosure.

FIG. 4 is a mapping image obtained by analyzing a nanospring synthesized using electrodeposition with a transmission electron microscope and element analysis according to an example embodiment of the present disclosure.

Referring to FIG. 4, a composition ratio of cobalt (Co) is 53.28 atomic percent, a composition ratio of iron (Fe) is 45.39 atomic percent, and a composition ratio of vanadium (V) is 1.32 atomic percent. Accordingly, the nanospring includes a CoFe alloy. The composition ratio was analyzed using energy-dispersive X-ray spectroscopy (EDX).

Figure 5:
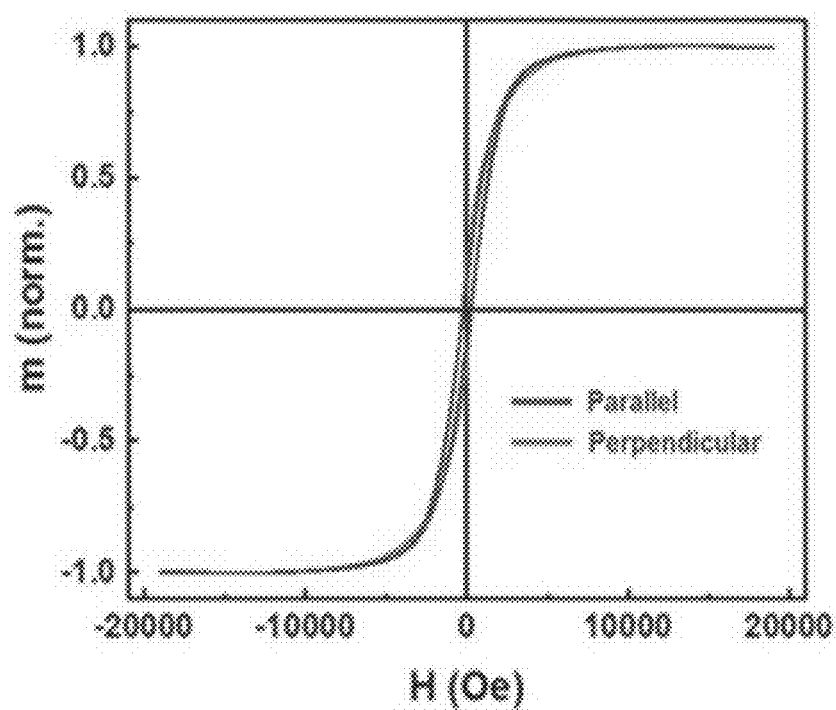
FIG. 5 is a graph illustrating magnetic properties of a nanospring synthesized using electrodeposition according to an example embodiment of the present disclosure.

FIG. 5 is a graph illustrating magnetic properties of a nanospring synthesized using electrodeposition according to an example embodiment of the present disclosure.

Referring to FIG. 5, magnetic properties of a CoFe nanospring array were measured using a vibrating sample magnetometer (VSM). A parallel direction is a case where an external magnetic field and a central axis of a nanospring are aligned in the same direction, and a vertical direction is a case where the external magnetic field and the central axis of the nanospring are perpendicular to each other. A hysteresis loop exhibits ferromagnetic properties. In the parallel case, coercivity is 285 Oersteds (Oe). In the vertical case, coercivity is 201 Oe.

Figure 6:
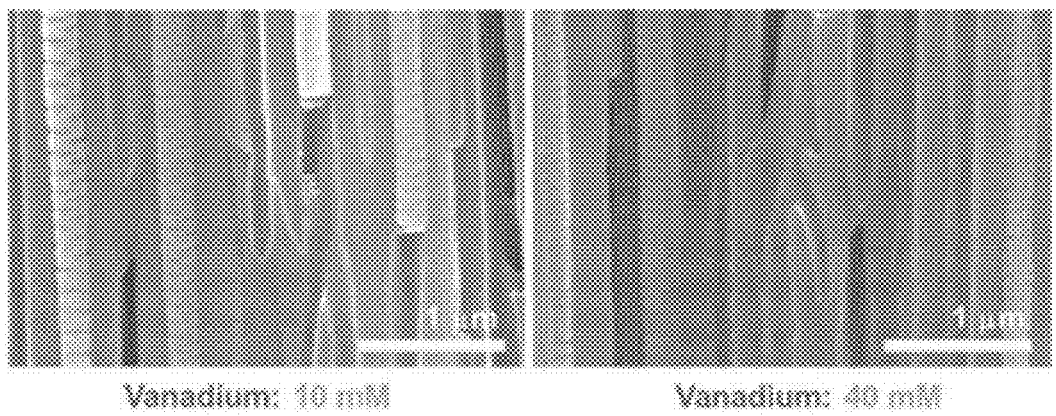
FIG. 6 is an image illustrating that a thickness of a nanospring may be adjusted depending on the content of vanadium oxide sulfate (VOSO$_4$.xH$_2$O) according to an example embodiment of the present disclosure.

FIG. 6 is an image illustrating that a thickness of a nanospring may be adjusted depending on the content of vanadium oxide sulfate ($VOSO_4 \cdot xH_2O$) according to an example embodiment of the present disclosure.

Referring to FIG. 6, when a concentration of vanadium oxide sulfate ($VOSO_4 \cdot xH_2O$) is 10 mM, a nanospring is synthesized to a thickness between about 100 and about 150 nm. When the concentration of vanadium oxide sulfate ($VOSO_4 \cdot xH_2O$) is 40 mM, the nanospring is synthesized to a thickness between about 20 and about 70 nm.

Figure 7:
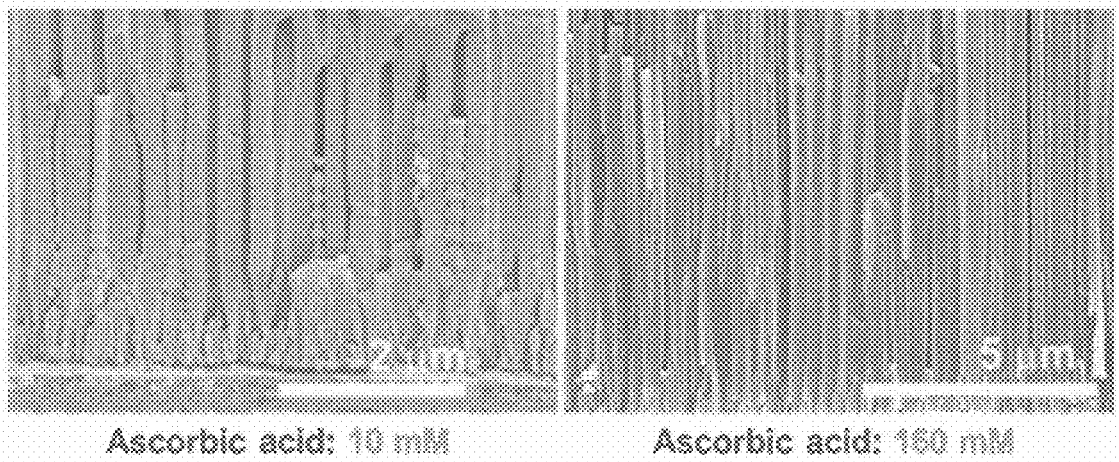
FIG. 7 is an image illustrating a shape of a synthesized nanostructure depending on a concentration of ascorbic acid according to an example embodiment of the present disclosure.

FIG. 7 is an image illustrating a shape of a synthesized nanostructure depending on a concentration of ascorbic acid according to an example embodiment of the present disclosure.

Referring to FIG. 7, a nanospring is synthesized within a specific ascorbic acid concentration range from 20 mM to 100 mM. Thus, the nanospring is not synthesized when the ascorbic acid concentration is too low or high. For example, a shape cannot be defined when the ascorbic acid concentration is 10 mM, and a nanowire is synthesized when the ascorbic acid concentration is 160 mM.

According to an example embodiment of the present disclosure, a transition metal and/or alloy spring having magnetic properties may be synthesized by template-based electrodeposition using a precursor solution containing metal or metal oxide. A material of the nanospring may be controlled depending on an element contained in the precursor solution. Moreover, by using a nano-sized or micro-sized nanoporous template in a plating bath, a length and a size of the nanospring may be easily controlled according to a size and a shape of a nanopore.

According to an example embodiment of the present disclosure, a magnetic transition metal and/or alloy nanospring of 200 nm or less manufactured through template-based electrodeposition has a high specific surface area. Thus, the nanospring may provide high sensitivity and high recovery speed. A nanospring structure may allow tensile strength and elasticity to be significantly improved. Moreover, since bandgap change of an electronic structure is accompanied, specificity of an electromagnetic wave absorption behavior may be expected.

According to an example embodiment of the present disclosure, nanosprings of various shapes and/or materials may be manufactured using a simple process method.

Although the present disclosure and its advantages have been described in detail, it should be understood that various changes, substitutions and alterations can be made herein without departing from the spirit and scope of the disclosure as defined by the following claims.

What is claimed is:

1. A method for manufacturing a metallic nanospring, comprising:
   preparing a nanotemplate having a nanopore and including a working electrode disposed on a surface of the nanotemplate;
   preparing a first metal precursor mixture including ascorbic acid ($C_6H_8O_6$), vanadium (IV) oxide sulfate hydrate ($VOSO_4 \cdot xH_2O$), and a metal precursor solution including a metal desired to be deposited;
   preparing a second metal precursor mixture by mixing the first metal precursor mixture with nitric acid ($HNO_3$);
   depositing a metallic nanospring into the nanopore using electrodeposition by dipping the nanotemplate into the second metal precursor mixture and applying current between a counter electrode inserted into the second metal precursor mixture and the working electrode; and selectively removing both the working electrode and the nanotemplate, on which the metallic nanospring was deposited, to obtain the metallic nanospring.

2. The method according to claim 1, wherein:

the metal precursor solution includes at least one of cobalt (II) sulfate heptahydrate ($CoSO_4 \cdot 7H_2O$) and iron (II) sulfate heptahydrate ($FeSO_4 \cdot 7H_2O$).

3. The method according to claim 2, wherein:

a concentration of cobalt (II) sulfate heptahydrate ($CoSO_4 \cdot 7H_2O$) is 40 mM in the second metal precursor mixture, a concentration of vanadium (IV) oxide sulfate hydrate ($VOSO_4 \cdot xH_2O$) is 20 mM in the second metal precursor mixture, a concentration of iron (II) sulfate heptahydrate ($FeSO_4 \cdot 7H_2O$) is 40 mM in the second metal precursor mixture, and a concentration of ascorbic acid ($C_6H_8O_6$) is 20 mM in the second metal precursor mixture.

4. The method according to claim 3, wherein:

a pH of the second metal precursor mixture is between 1.5 and 2.5.

5. The method according to in claim 1, wherein:

a mean diameter of the nanopore is between 5 and 500 nanometers.

6. The method according to claim 1, further comprising:

dipping the nanotemplate into the second metal precursor mixture and depressurizing a plating bath storing the second metal precursor solution, wherein a pressure of the plating bath is between 100 and 700 Torr.

7. The method according to claim 1, wherein:

a concentration of the ascorbic acid is between 20 and 100 mM in the second metal precursor mixture.

8. The method according to claim 1, wherein:

a density of current flowing to the working electrode during electrodeposition is between 0.1 and 300 mA/cm$^2$, and a time required for the electrodeposition is between one minute and 48 hours.

* * * * *